(12) United States Patent
Kim et al.

(10) Patent No.: US 10,090,483 B2
(45) Date of Patent: Oct. 2, 2018

(54) ORGANIC LIGHT-EMITTING DEVICE

(71) Applicant: SEOUL NATIONAL UNIVERSITY R&DB FOUNDATION, Seoul (KR)

(72) Inventors: Jang-Joo Kim, Seoul (KR); Jin-Won Sun, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/662,619

(22) Filed: Jul. 28, 2017

(65) Prior Publication Data
US 2018/0033987 A1 Feb. 1, 2018

(30) Foreign Application Priority Data

Jul. 29, 2016 (KR) .................... 10-2016-0097024

(51) Int. Cl.
*H01L 51/00* (2006.01)
*H01L 51/44* (2006.01)
*H01L 51/50* (2006.01)

(52) U.S. Cl.
CPC .......... *H01L 51/442* (2013.01); *H01L 51/506* (2013.01); *H01L 51/5012* (2013.01); *H01L 51/004* (2013.01); *H01L 51/0035* (2013.01)

(58) Field of Classification Search
CPC ..................................... H01L 51/442
USPC ........................................ 257/40
See application file for complete search history.

(56) References Cited

U.S. PATENT DOCUMENTS

| 2009/0033212 A1* | 2/2009 | Ahn | H01L 51/5036 313/504 |
| 2010/0052527 A1* | 3/2010 | Ikeda | H01L 51/5016 313/504 |
| 2012/0126208 A1* | 5/2012 | Kawamura | H01L 51/0061 257/40 |
| 2012/0241732 A1* | 9/2012 | Endo | C09B 57/00 257/40 |

(Continued)

FOREIGN PATENT DOCUMENTS

| JP | 2014-0044942 A | 3/2014 |
| JP | 2016-0119355 A | 6/2016 |
| KR | 2015-0126381 A | 11/2015 |

OTHER PUBLICATIONS

Office Action corresponding to Korean Patent Application No. 10-2016-0097024, dated Dec. 15, 2017.

*Primary Examiner* — Igwe U Anya
(74) *Attorney, Agent, or Firm* — Kilpatrick Townsend & Stockton

(57) ABSTRACT

An organic light-emitting device is provided, including: a first electrode; a second electrode; and an organic layer between the first electrode and the second electrode, wherein the organic layer includes an emission layer; the emission layer includes a first compound, a second compound, a third compound, and a fourth compound; and a lowest excited triplet energy level ($H_{T1}$) of the first compound, a lowest excited triplet energy level ($DFD_{T1}$) of the third compound, and a lowest excited triplet energy level ($FD_{T1}$) of the fourth compound satisfy Inequation 1:

$H_{T1} > DFD_{T1} > FD_{T1}$.  <Inequation 1>

10 Claims, 4 Drawing Sheets

(56) References Cited

U.S. PATENT DOCUMENTS

2016/0056393 A1    2/2016  Oikawa et al.
2016/0315274 A1*  10/2016  Lennartz ............. H01L 51/0055
2017/0069864 A1*   3/2017  Lee ..................... H01L 51/5004
2017/0077412 A1*   3/2017  Lim .................... H01L 51/0061
2017/0092872 A1*   3/2017  Chae ................... C07D 403/10
2017/0250360 A1    8/2017  Seo et al.
2017/0331048 A1*  11/2017  Cho .................... C09K 11/025

* cited by examiner

ORGANIC LIGHT-EMITTING DEVICE

CROSS-REFERENCE TO RELATED APPLICATION

This application claims the benefit of Korean Patent Application No. 10-2016-0097024, filed on Jul. 29, 2016, in the Korean Intellectual Property Office, the disclosure of which is incorporated herein in its entirety by reference.

BACKGROUND

1. Field

One or more embodiments relate to an organic light-emitting device.

2. Description of the Related Art

Organic light-emitting devices are self-emitting devices based on an electroluminescent phenomenon in which light is emitted from organic compounds when an electric current is applied thereto.

An organic light-emitting device may have a structure in which a first electrode, an organic layer including an emission layer, and a second electrode are sequentially stacked upon one another in this stated order. Holes injected from the first electrode and electrons injected from the second electrode migrate toward the emission layer and recombine in the emission layer to generate excitons. As these excitons transit from an excited state to a ground state, light is emitted.

In particular, blue fluorescent organic light-emitting devices have relatively low efficiency. Therefore, there is a need to develop an organic light-emitting device having improved efficiency.

SUMMARY

One or more embodiments include an organic light-emitting device, and in particular, an organic light-emitting device having improved efficiency.

Additional aspects will be set forth in part in the description which follows and, in part, will be apparent from the description, or may be learned by practice of the presented embodiments.

According to one or more embodiments, an organic light-emitting device includes: a first electrode; a second electrode; and an organic layer between the first electrode and the second electrode, wherein the organic layer includes an emission layer; the emission layer includes a first compound, a second compound, a third compound, and a fourth compound, and a lowest excited triplet energy level ($H_{T1}$) of the first compound, a lowest excited triplet energy level ($DFD_{T1}$) of the third compound, and a lowest excited triplet energy level ($FD_{T1}$) of the fourth compound satisfy Inequation 1:

$$H_{T1} > DFD_{T1} > FD_{T1}. \qquad \text{<Inequation 1>}$$

In some embodiments, based on a total weight of the first, second, third and fourth compounds in the emission layer, an amount of the first compound may be greater than or equal to an amount of each of the second, third, and fourth compounds in the emission layer In some embodiments, the second compound may include a metal atom having an atomic weight of about 40 or greater.

In some embodiments, a difference between a lowest excited singlet energy level ($DFD_{S1}$) and the lowest excited triplet energy level ($DFD_{T1}$) of the third compound at about 77K may be in a range of greater than about 0 eV to about 0.3 eV or less.

In some embodiments, the third compound may be represented by one of Formulae 1 to 3:

D-C-A                                                        <Formula 1>

D-C-A-C-D                                      <Formula 2>

A-C-D-C-A                                      <Formula 3> wherein, in Formulae 1 to 3, D may be an electron donating group; C may be a linking group; and A may be an electron accepting group.

In some embodiments, the fourth compound may emit light.

In some embodiments, a maximum light emission wavelength of the fourth compound may be about 350 nm to about 550 nm.

In some embodiments, based on a total weight of the first, second, third and fourth compounds in the emission layer, an amount of the fourth compound may be smaller than an amount of each of the first, second, and third compounds in the emission layer.

In some embodiments, the emission layer may further include a fifth compound.

In some embodiments, the emission layer may further include a fifth compound, and the first compound and the fifth compound may each independently be selected from a carbazole-containing compound, an aromatic amine compound, a π-electron-deficient heteroaromatic compound, a phosphine oxide-containing compound, and a sulfur oxide-containing compound, and the first compound and the fifth compound may be different from one another.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
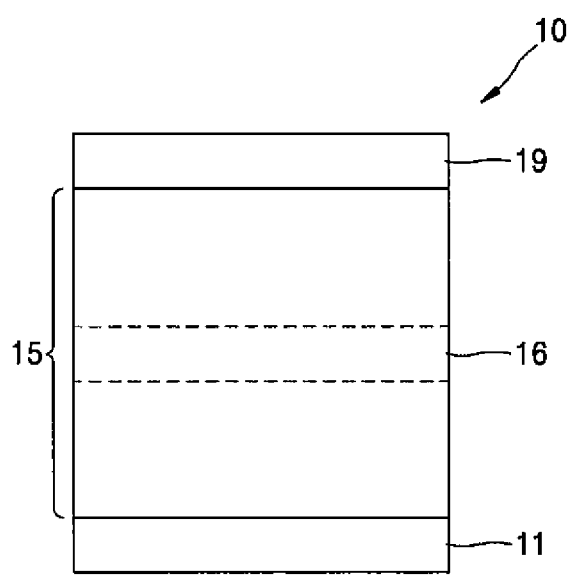
FIG. 1 is a schematic cross-sectional view of a structure of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view of a structure of an organic light-emitting device 10 according to an embodiment.

Referring to FIG. 1, the organic light-emitting device 10 may include a first electrode 11, a second electrode 19, and an organic layer 15. The organic layer 15 may include an emission layer 16. The emission layer 16 may include a first compound, a second compound, a third compound, and a fourth compound, wherein a lowest excited triplet energy level ($H_{T1}$) of the first compound, a lowest excited triplet energy level ($DFD_{T1}$) of the third compound, and a lowest excited triplet energy level ($FD_{T1}$) of the fourth compound may satisfy Inequation 1.

$$H_{T1} > DFD_{T1} > FD_{T1}. \qquad \text{<Inequation 1>}$$

In some embodiments, the first compound may not emit light.

For example, the first compound may serve as a host. However, embodiments are not limited thereto.

In some embodiments, the first compound may be a known host

For example, the first compound may be selected from a carbazole-containing compound, an aromatic amine compound, a π-electron-lacking heteroaromatic compound, a phosphine oxide-containing compound, and a sulfur oxide-containing compound.

In some embodiments, the first compound may be selected from mCP (1,3-bis(9-carbazolyl)benzene), TCTA (tris(4-carbazoyl-9-ylphenyl)amine), CBP (4,4'-bis(N-carbazolyl)-1,1'-biphenyl), mCBP (3,3-bis(carbazol-9-yl)bipheny), NPB (N,N'-di(1-naphthyl)-N,N'-diphenyl-(1,1'-biphenyl)-4,4'-diamine), m-MTDATA (4,4',4"-tris[phenyl(m-tolyl)amino]triphenylamine), TPD (N,N'-bis(3-methylphenyl)-N,N'-diphenylbenzidine), B3PYMPM (bis-4,6-(3,5-di-3-pyridylphenyl)-2-methylpyrimi-dine), B4PYMPM (bis-4,6-(3,5-di-4-pyridylphenyl)-2-methylpyrimi-dine), TPBi (2,2',2"-(1,3,5-benzenetriyl)tris-[1-phenyl-1H-benzimidazole]), 3TPYMB (tris(2,4,6-triMethyl-3-(pyridin-3-yl)phenyl)borane), BmPyPB (1,3-bis[3,5-di(pyridin-3-yl) phenyl]benzene), TmPyPB (3,3'-[5'-[3-(3-pyridinyl)phenyl][1,1':3',1"-terphenyl]-3,3"-diyl]bispyridine), BSFM, PO-T2T PO15 (dibenzo[b,d]thiophene-2,8-diylbis(diphenylphosphine oxide)), DPEPO (bis[2-(diphenylphosphino)phenyl] ether oxide), and TSPO1 (diphenyl-4-triphenylsilylphenyl-phosphineoxide), which are represented by the following formulae. However, embodiments are not limited thereto.

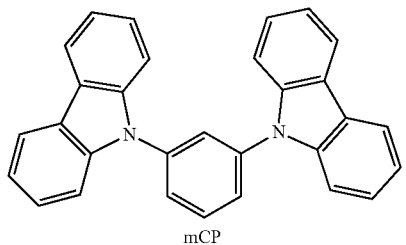

mCP

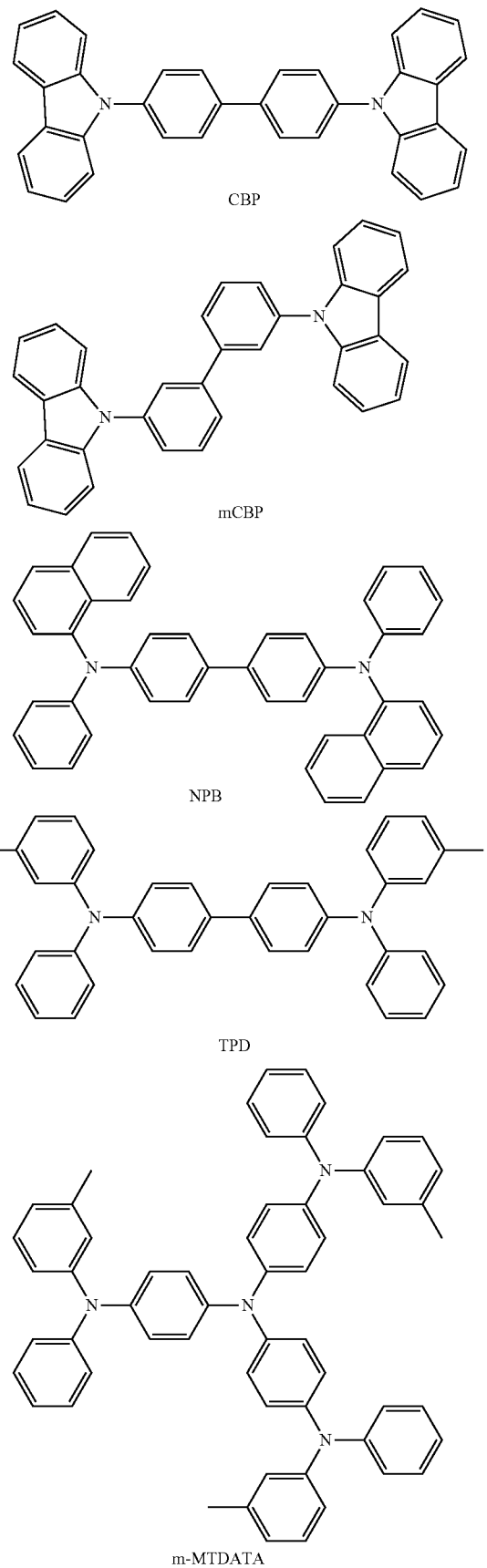

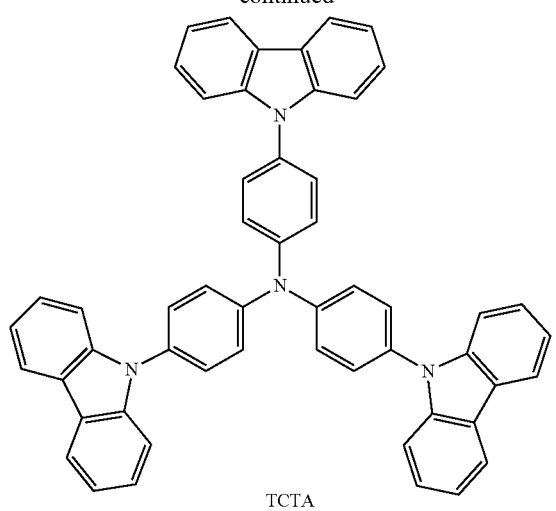
TCTA
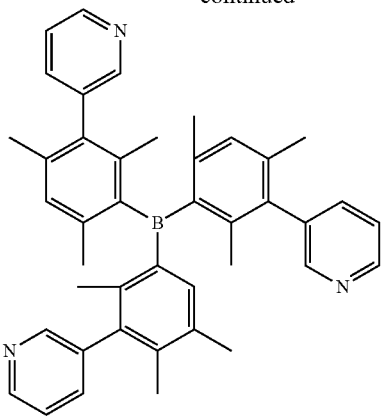
3TPYMB
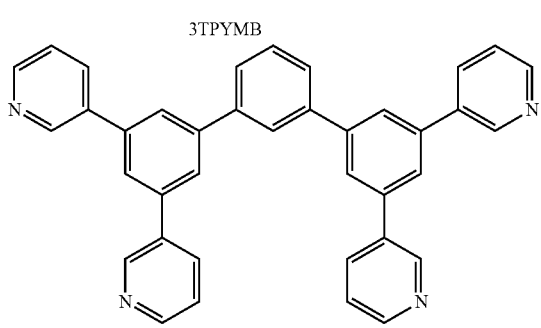
BmPyPB
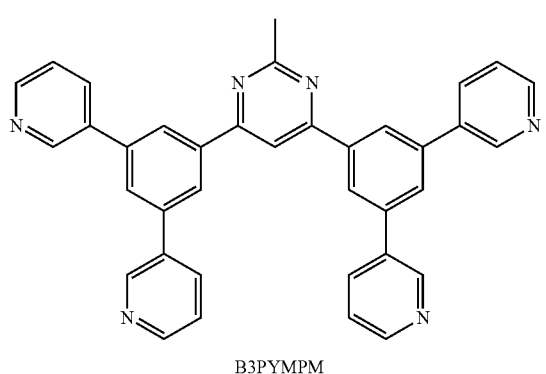
B3PYMPM
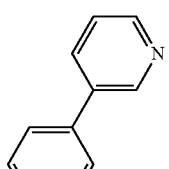
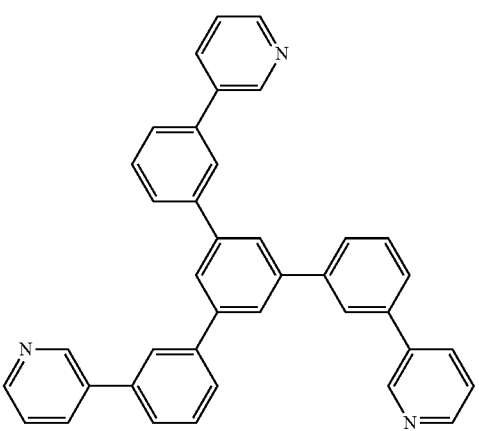
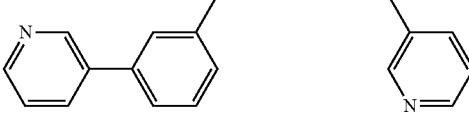
TmPyPB
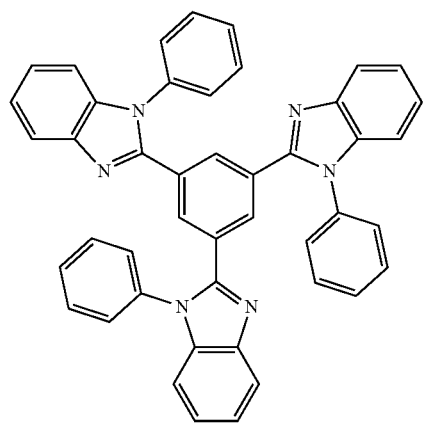
TPBI
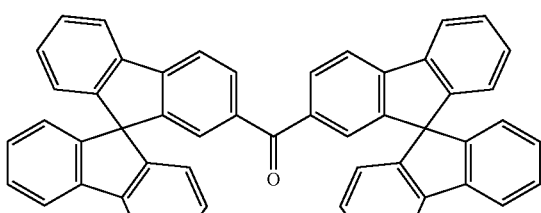
BSFM

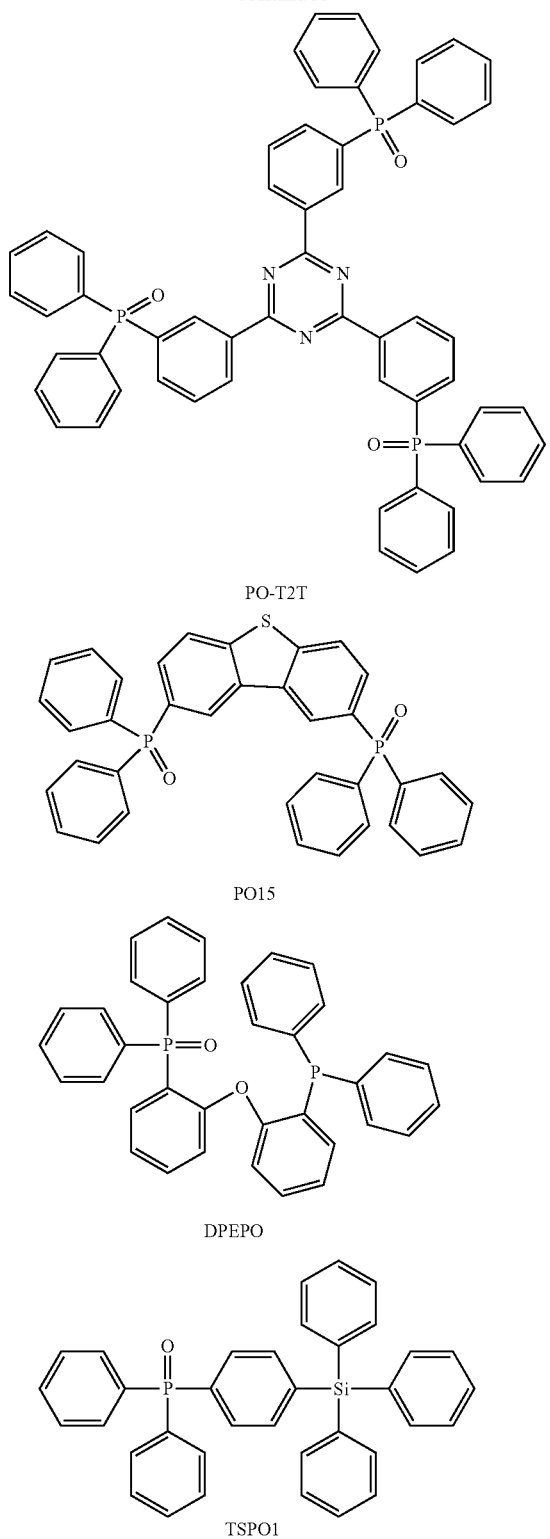

PO-T2T

PO15

DPEPO

TSPO1

In some embodiments, based on a total weight of the first, second, third and fourth compounds in the emission layer, an amount of the first compound may be greater than or equal to an amount of each of the second, third, and fourth compounds in the emission layer[e1]. However, embodiments are not limited thereto.

In some embodiments, the amount of the first compound may be about 97 wt % to about 50 wt % based on a total weight of the emission layer. However, embodiments are not limited thereto.

For example, the amount of the first compound may be about 95 wt % or less, about 90 wt % or less, about 85 wt % or less, about 60 wt % or more, about 70 wt % or more, or about 80 wt % or more based on a total weight of the emission layer. However, embodiments are not limited thereto.

In some embodiments, the second compound may not emit light.

In some embodiments, a lowest excited triplet energy level ($PD_{T1}$) of the second compound may be different from a lowest excited triplet energy level ($DFD_{T1}$) of the third compound. However, embodiments are not limited thereto.

In some embodiments, the second compound may include a metal atom having an atomic weight of about 40 or greater. However, embodiments are not limited thereto.

For example, the second compound may include iridium (Ir), platinum (Pt), osmium (Os), ruthenium (Ru), rhodium (Rh), palladium (Pd), copper (Cu), silver (Ag), gold (Au), titanium (Ti), zirconium (Zr), hafnium (Hf), europium (Eu), terbium (Tb), or thulium (Tm). However, embodiments are not limited thereto.

In some other embodiments, the second compound may include Ir(ppy)$_3$, Ir(ppy)$_2$(acac), Ir(mppy)$_3$, Ir(mpp)$_2$acac, F$_2$Irpic, (F$_2$ppy)$_2$Ir(tmd), Ir(ppy)$_2$tmd, Ir(pmi)$_3$, Ir(pmb)$_3$, FCNIr, FCNIrpic, FIr6, FIrN4, FIrpic, PtOEP, Ir(chpy)$_3$, PO-01 (C$_{31}$H$_{23}$IrN$_2$O$_2$S$_2$), Ir(HFP)$_2$(pic), Ir(HFP)$_2$(mpic), Ir(ppz)$_3$, or Ir(dfppz)$_3$. However, embodiments are not limited thereto.

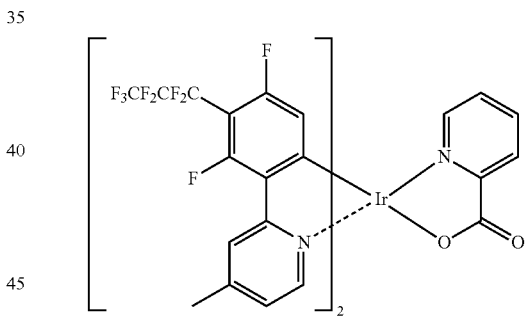

Ir(HFP)$_2$(pic)

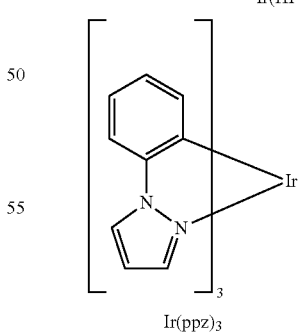

Ir(ppz)$_3$

In some embodiments, an amount of the second compound may be about 1 wt % to about 30 wt % based on a total weight of the emission layer. However, embodiments are not limited thereto.

For example, the amount of the second compound may be about 7 wt % to about 15 wt %, and in some embodiments, about 10 wt %, based on a total weight of the emission layer. However, embodiments are not limited thereto.

In some embodiments, a difference between a lowest excited singlet energy level ($DFD_{S1}$) and the lowest excited triplet energy level ($DFD_{T1}$) of the third compound at about 77K is greater than about 0 eV to about 0.3 eV or less. However, embodiments are not limited thereto.

For example, a difference between $DFD_{S1}$ and $DFD_{T1}$ of the third compound at about 77K may be greater than 0 eV to less than 0.1 eV. However, embodiments are not limited thereto.

In some embodiments, the third compound may be a delayed fluorescent material. However, embodiments are not limited thereto. As used herein, the term "a delayed fluorescent material" refers to a compound in which reverse intersystem crossing (RISC) occurs as an electron transits from the lowest excited triplet energy level to the lowest excited singlet energy level. In general, a lifetime of light emitted by RISC is longer than that of fluorescence or phosphorescence. This light is called delayed fluorescence.

In some embodiments, the third compound may be represented by one of Formulae 1 to 3. However, embodiments are not limited thereto.

D-C-A <Formula 1>

D-C-A-C-D <Formula 2>

A-C-D-C-A <Formula 3>

In Formulae 1 to 3,

D may be an electron donating group,

C may be a linking group, and

A may be an electron accepting group.

D-C-A denotes a compound having a structure in which D is connected to A by C. Structures of the third compounds of Formula 2 and 3 may be understood based on the above-described structure of the third compound of Formula 1.

For example, D may include a carbazole group, a phenoxazinyl group, a phenothiazinyl group, a dibenzoazasilinanyl group, or an aromatic amine group. However, embodiments are not limited thereto.

For example, A may include a cyano group, —F, a phenyl group substituted with a cyano group, a phenyl group substituted with —F, a pyridyl group, a pyrrole group, a triazinyl group, a carbonyl group, a phosphine oxide group, or a sulfur oxide group. However, embodiments are not limited thereto.

For example, C may include an arylene group, such as a phenylene group or a naphthylenyl group. However, embodiments are not limited thereto.

In Formulae 1 to 3, D, A, and C may each independently be a monovalent group or a divalent group, according to the structures of Formulae 1 to 3.

In some embodiments, the third compound may include 4CzIPN, 2CzPN, 4CzTPN-Ph, PXZ-DPS, DTPPDDA, or BDAPM. However, embodiments are not limited thereto.

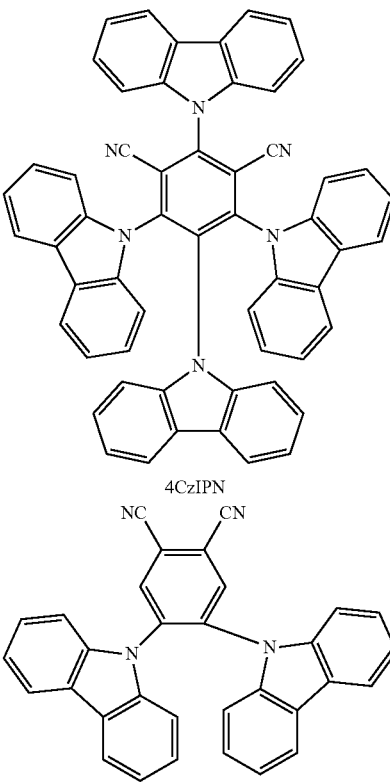

4CzIPN

2CzPN

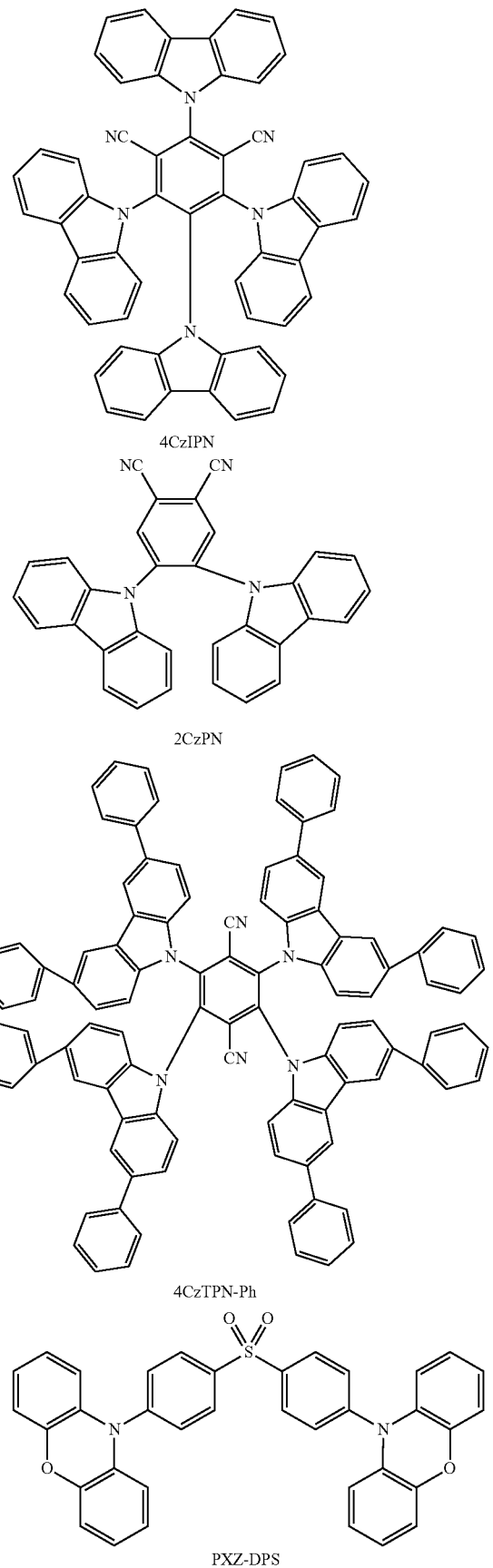

4CzTPN-Ph

PXZ-DPS

-continued

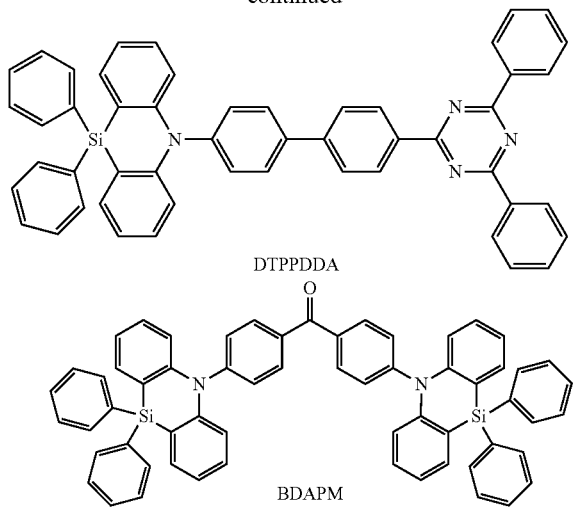

DTPPDDA

BDAPM

In some embodiments, an amount of the third compound may be about 1 wt % to about 30 wt % based on a total weight of the emission layer. However, embodiments are not limited thereto.

For example, the amount of the third compound may be about 5 wt % or more, about 8 wt % or more, about 10 wt % or more, about 12 wt % or more, about 14 wt % or less, about 16 wt % or less, about 18 wt % or less, or about 20 wt % or less, based on a total weight of the emission layer. However, embodiments are not limited thereto.

In some embodiments, the fourth compound may emit light. However, embodiments are not limited thereto. The fourth compound may serve as a dopant.

For example, the fourth compound may emit fluorescence. However, embodiments are not limited thereto. The fluorescence emission of the fourth compound may mean that light is emitted as the fourth compound transits from a lowest excited singlet energy level to a ground energy level.

For example, a maximum light emission wavelength of the fourth compound may be about 350 nm to about 550 nm. However, embodiments are not limited thereto. When the fourth compound has a maximum light emission wavelength within this range, the fourth compound may emit blue light.

In some embodiments, the fourth compound may be a known fluorescent dopant.

For example, the fourth compound may include perylene, TBPe (2,5,8,11-tetra-tert-butylperylene), BCzVB (1,4-bis[2-(3-N-ethylcarbazoryl)vinyl]benzene), BCzVBi (4,4'-bis(9-ethyl-3-carbazovinylene)-1,1'-biphenyl), BDAVBi (4,4'-bis[4-diphenylamino]styryl)biphenyl), DPAVB (4-(di-p-tolylamino)-4'-[(di-p-tolylamino)styryl]stilbene), DPAVBi (4,4'-bis[4-(di-p-tolylamino)styryl]bipnehyl), DSA-Ph(1-4-di-[4-(N,N-diphenyl)amino]styryl-benzene), Coumarin 6, C545T, DMQA (N,N'-dimethyl-quinacridone), DBQA (5,12-Dibutylquinacridone), TTPA (9,10-bis[N,N-di-(p-tolyl)-amino]anthracene), TPA (9,10-bis[phenyl(m-tolyl)-amino]anthracene), BA-TTB ($N^{10},N^{10},N^{10'},N^{10'}$-tetra-tolyl-9,9'-bianthracene-10,10'-diamine), BA-TAB ($N^{10},N^{10},N^{10'},N^{10'}$-tetraphenyl-9,9'-bianthracene-10,10'-diamine), BA-NPB ($N^{10},N^{10'}$-diphenyl-$N^{10},N^{10'}$-dinaphthalenyl-9,9'-bianthracene-10,10'-diamine), DEQ (N,N'-diethylquinacridone), DCM (4-(dicyanomethylene)-2-methyl-6-[p-(dimethylamino)styryl]-4H-pyran), DCM2 (4-(dicyanomethylene)-2-methyl-6-julolidyl-9-enyl-4H-pyran), DCJT (4-(dicyanomethylene)-2-methyl-6-(1,1,7,7-tetramethyljulolidyl-9-enyl)-4H-pyran), DCJTB (4-(dicyanomethylene)-2-tert-butyl-6-(1,1,7,7-tetramethyljulolidyl-9-enyl)-4H-pyran), DCJTI, DCJMTB, DPP (6,13-diphenylpentacene), DCDDC (3-(dicyanomethylene)-5,5-dimethyl-1-[(4-dimethylamino)styryl]cyclohexene), AAAP (6-methyl-3-[3-(1,1,6,6-tetramethyl-10-oxo-2,3,5,6-tetrahydro-1H,4H,10H-11-oxa-3a-azabenzo[de]-anthracen-9-yl)acryloyl]pyran-2,4-dione), (PPA)(PSA)Pe-1 (3-(N-phenyl-N-p-tolylamino)-9-(N-p-styrylphenyl-N-p-tolylamino)perylene), BSN (1,10-dicyano-substituted bisstyryl naphthalene derivative), DBP (tetraphenyldibenzoperiflanthene), TBRb (2,8-di-tert-butyl-5,11-bis(4-tert-butylphenyl)-6,12-diphenyltetrazene), or rubrene. However, embodiments are not limited thereto.

In some embodiments, the fourth compound may be TBPe. However, embodiments are not limited thereto.

In some embodiments, based on a total weight of the first, second, third and fourth compounds in the emission layer, an amount of the fourth compound may be smaller than the amount of each of the first, second, and third compounds. However, embodiments are not limited thereto. When the amount of the fourth compound is the smallest among all the compounds in the emission layer, only Forster energy transfer may be possible.

For example, the amount of the fourth compound may be greater than about 0 wt % to about 1 wt % or less based on a total weight of the emission layer. However, embodiments are not limited thereto.

In some other embodiments, the amount of the fourth compound may be about 0.01 wt % or more, about 0.1 wt % or more, about 0.3 wt % or more, about 0.5 wt % or more, about 0.9 wt % or less, or about 0.7 wt % or less, based on a total weight of the emission layer. However, embodiments are not limited thereto.

When the organic light-emitting device includes an amount of the fourth compound within the above-described ranges, only Forster energy transfer may be possible, and Dexter energy transfer may be prevented. That is, energy transfer to the lowest excited triplet energy level of the fourth compound may be prevented, allowing every exciton to participate in fluorescence emission and thus reducing non-radiative loss.

In some embodiments, the emission layer may further include a fifth compound. The fifth compound may serve as a host. The above description of the first compound may apply to the fifth compound, and thus a detailed description of the fifth compound will be omitted.

In some embodiments, the first compound and the fifth compound may or may not form an exciplex. However, embodiments are not limited thereto.

In some embodiments, the first compound and the fifth compound may each independently be selected from a carbazole-containing compound, an aromatic amine compound, a π-electron-lacking heteroaromatic compound, a phosphine oxide-containing compound, and a sulfur oxide-containing compound. The first compound and the fifth compound may be different from each other. However, embodiments are not limited thereto.

In some other embodiments, the first compound may be a hole transporting host, and the fifth compound may be an electron transporting host; or the first compound may be an electron transporting host, and the fifth compound may be a hole transporting host. However, embodiments are not limited thereto.

In some other embodiments, i) the first compound may be selected from a carbazole-containing compound and an aromatic amine compound, and the fifth compound may be selected from a π-electron-lacking heteroaromatic compound, a phosphine oxide-containing compound, and a sulfur oxide-containing compound; or ii) the first compound may be selected from a π-electron-lacking heteroaromatic compound, a phosphine oxide-containing compound, and a sulfur oxide-containing compound, and the fifth compound may be selected from a carbazole-containing compound and an aromatic amine compound. However, embodiments are not limited thereto.

In some embodiments, the first compound may be selected from mCP, TCTA, CBP, mCBP, NPB, m-MTDATA, and TPD, and the fifth compound may be selected from B3PYMPM, B4PYMPM, TPBi, 3TPYMB, BmPyPB, TmPyPB, BSFM, PO-T2T, PO15, DPEPO, and TSPO1 as represented above. However, embodiments are not limited thereto.

In some other embodiments, the first compound may be selected from B3PYMPM, B4PYMPM, TPBi, 3TPYMB, BmPyPB, TmPyPB, BSFM, PO-T2T, PO15, DPEPO, and TSPO1, and the fifth compound may be selected from mCP, TCTA, CBP, mCBP, NPB, m-MTDATA, and TPD. However, embodiments are not limited thereto.

For example, a combination of the first compound and the fifth compound may be selected from TCTA: B4PYMPM, TCTA:B3PYMPM, TCTA:TPBi, TCTA:3TPYMB, TCTA: BmPyPB, TCTA:BSFM, CBP:B3PYMPM, mCP: B3PYMPM, and NPB:BSFM. However, embodiments are not limited thereto. When a combination of the first compound and the fifth compound is selected from these combinations, the first compound and the fifth compound may form an exciplex.

When the emission layer further include a fifth compound as described above, a weight ratio of the first compound to the fifth compound may be about 20:80 to about 80:20. However, embodiments are not limited thereto. For example, a weight ratio of the first compound to the fifth compound may be about 30:70 to about 70:30, about 40:60 to about 60:40, or about 50:50. However, embodiments are not limited thereto.

When the first compound and the fifth compound form an exciplex, the organic light-emitting device may further satisfy Inequation 2.

$$EX_{T1} > DFD_{T1} > FD_{T1}.$$  <Inequation 2>

In Inequation 2, $EX_{T1}$ indicates a lowest excited triplet energy level of an exciplex formed by the first compound and the fifth compound, and $DFD_{T1}$ and $FD_{T1}$ are each defined as described above.

Since the organic light-emitting device includes a first compound, a second compound, a third compound, and a fourth compound as described above in the emission layer, and the first, second, third, and fourth compounds satisfy Inequation 1, energy may be transferred from the first compound to the third compound and from the third compound to the fourth compound. In some embodiments, the first compound, the second compound, and the third compound may generate excitons by recombination of holes and electrons in the emission layer.

Since the amount of the fourth compound in the emission layer is relatively low, the fourth compound may not directly participate in generation of excitons, but may emit fluorescence due to energy transferred from generated excitons.

The second compound may assist the third compound. The second compound may improve RISC of the third compound and a concentration of triplet excitons in the third compound, thus increasing a total amount of excitons of the third compound. Accordingly, energy transfer to the fourth compound may be amplified, and thus efficiency of the organic light-emitting device may be improved.

Referring back to FIG. 1, the organic light-emitting device 10 may further include a substrate (not shown) on a lower surface of the first electrode 11 (opposite to the organic layer 15) or on an upper surface of the second electrode 19 (opposite to the organic layer 15). The substrate may be any substrate commonly used in an organic light-emitting device, for example, may be a glass or transparent plastic substrate having good mechanical strength, thermal stability, transparency, surface smoothness, ease of handling, and water resistance.

The first electrode 11 of the organic light-emitting device 10 may be an anode to which a positive (+) voltage is applied, and the second electrode 19 may be a cathode to which a negative (−) voltage is applied. In some other embodiments, the first electrode 11 may be a cathode, and the second electrode 19 may be an anode. For convenience of explanation, embodiments including the first electrode 11 as an anode and the second electrode 19 as a cathode will be described below.

The first electrode 11 may be formed as a transparent electrode or a reflective electrode. For a bottom-emission type, the first electrode 11 may be formed as a transparent electrode. The transparent electrode may be formed using ITO, IZO, ZnO or graphene. As a reflective electrode, the first electrode 11 may be formed by forming a reflective layer of Ag, Mg, Al, Pt, Pd, Au, Ni, Nd, Ir, Cr, or a combination thereof and then forming a layer of ITO, IZO, ZnO, or graphene on the reflective layer. The first electrode 11 may be formed using any of various known methods, for example, deposition, sputtering, or spin coating.

The organic layer 15 may further include a hole transport region (not shown) between the emission layer 16 and the first electrode 11, and an electron transport region (not shown) between the emission layer 16 and the second electrode 19. The hole transport region is a region associated with injection and transport of holes from the anode (i.e., the first electrode 11) to the emission layer 16, and the electron transport region is a region associated with injection and transport of electrons from the cathode (i.e., the second electrode 19) to the emission layer 16.

The hole transport region may include at least one of a hole injection layer, a hole transport layer, an electron blocking layer, and a buffer layer.

The hole transport region may include only a hole injection layer or only a hole transport layer. In some other embodiments, the hole transport region may have a structure including a hole injection layer and a hole transport layer stacked sequentially on the first electrode 11 in the stated order or a structure including a hole injection layer, a hole transport layer, and an electron blocking layer stacked sequentially on the first electrode in this stated order.

When the hole transport region includes a hole injection layer, the hole injection layer may be formed on the first electrode 11 by using any of various methods, for example, vacuum deposition, spin coating, casting, or Langmuir-Blodgett (LB) deposition.

A material of the hole injection layer may be a known hole injection material, for example, a phthalocyanine compound such as copper phthalocyanine, m-MTDATA, TDATA, TAPC (4,4'-Cyclohexylidenebis[N,N-bis(4-methylphenyl) benzenamine]), 2-TNATA (4,4',4''-Tris[2-naphthyl(phenyl) amino]triphenylamine), PANI/DBSA (polyaniline/dodecyl-benzenesulfonic acid), PEDOT/PSS (poly(3,4-ethylenedioxythiophene)/poly(4-styrene sulfonate)), PANI/CSA (polyaniline/camphor sulfonic acid), PANI/PSS (polyaniline/poly(4-styrene sulfonate)), or HATCN (1,4,5,8,9,11-hexaazatriphenylene-hexacarbonitrile). However, embodiments are not limited thereto.

When the hole transport region includes a hole transport layer, the hole transport layer may be formed on the first electrode 11 or a hole injection layer by using any of various methods, for example, vacuum deposition, spin coating, casting, or LB deposition.

The hole transport layer may be formed using a known hole transport material, for example, mCP (1,3-bis(9-carbazolyl)benzene), TCTA (tris(4-carbazoyl-9-ylphenyl)amine), CBP (4,4'-bis(N-carbazolyl)-1,1'-biphenyl), mCBP (3,3-bis(carbazol-9-yl)bipheny), NPB (N,N'-di(1-naphthyl)-N,N'-diphenyl-(1,1'-biphenyl)-4,4'-diamine)), m-MTDATA (4,4',4"-tris[phenyl(m-tolyl)amino]triphenylamine), or TPD (N,N'-bis(3-methylphenyl)-N,N'-diphenylbenzidine). However, embodiments are not limited thereto.

The emission layer 16 may be formed on the hole transport region by using any of various methods, for example, vacuum deposition, spin coating, casting, or LB deposition.

The hole transport region may further include a charge-generating material, in addition to the above-described materials, to improve conductivity. The charge-generating material may be homogeneously or inhomogeneously dispersed in the hole transport region.

The charge-generating material may be, for example, a p-dopant. Examples of the p-dopant are quinone derivatives such as TCNQ (tetracyanoquinodimethane), F4-TCNQ (2,3,5,6-Tetrafluoro-7,7,8,8-tetracyanoquinodimethane), and the like; metal oxides such as rhenium oxide, tungsten oxide, molybdenum oxide, and the like; and HAT-CN (1,4,5,8,9,11-hexaazatriphenylene-hexacarbonitrile). However, embodiments are not limited thereto.

The emission layer 16 is described above in detail, and thus will not be described further.

The electron transport region may be on the emission layer 16. The electron transport region may further include at least one of a hole blocking layer, an electron transport layer, and an electron injection layer.

For example, the electron transport region may have a structure of hole blocking layer/electron transport layer/electron injection layer, or a structure of electron transport layer/electron injection layer. However, embodiments are not limited thereto. The electron transport layer may have a single-layered structure or a multilayered structure including at least two different materials.

The hole blocking layer, the electron transport layer, and the electron injection layer of the electron transport region may be formed under the same conditions as the above-described conditions for forming the hole injection layer, and thus a detailed description thereof will be omitted.

The electron transport layer may be formed using a known electron transport material, for example, Alq$_3$, BCP (bathocuproine), Bphen (4,7-diphenyl-1,10-phenanthroline), TAZ (3-(biphenyl-4-yl)-5-(4-tert-butylphenyl)-4-phenyl-4H-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), Balq (bis(2-methyl-8-quinolinolato-N1,O8)-(1,1'-Biphenyl-4-olato)aluminum), Bebq$_2$ (bis(10-hydroxybenzo[h]quinolinato)beryllium), AND (9,10-di(naphth-2-yl)anthracene), B3PYMPM (bis-4,6-(3,5-di-3-pyridylphenyl)-2-methylpyrimi-dine), TPBi (2,2',2"-(1,3,5-benzenetriyl)tris-[1-phenyl-1H-benzimidazole]), 3TPYMB (tris(2,4,6-triMethyl-3-(pyridin-3-yl)phenyl)borane), BmPyPB (1,3-bis[3,5-di(pyridin-3-yl) phenyl] benzene), TmPyPB (3,3'-[5'-[3-(3-pyridinyl)phenyl][1,1:3',1"-terphenyl]-3,3"-diyl]bispyridine), BSFM, PO-T2T, TSPO1, DPEPO, or PO15 (dibenzo[b,d]thiophene-2,8-diyl-bis(diphenylphosphine oxide)) as represented below. However, embodiments are not limited thereto.

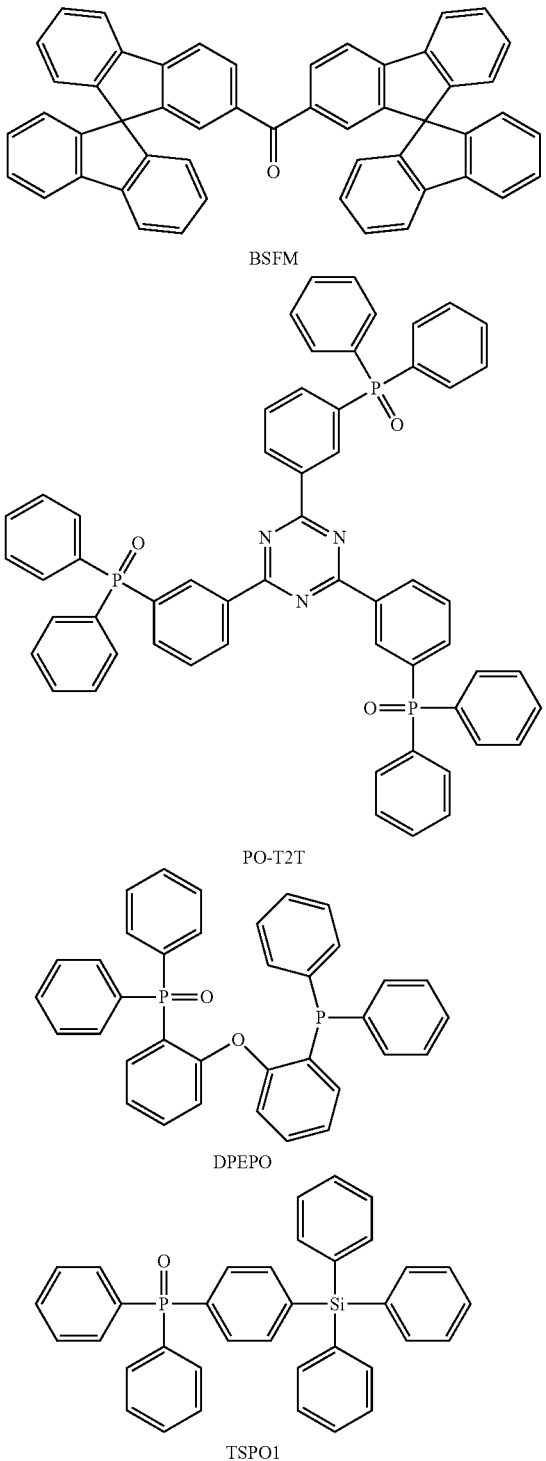

BSFM

PO-T2T

DPEPO

TSPO1

The electron transport layer may be doped with, for example, LiF, NaCl, CsF, Li$_2$O, BaO, Liq, or Rb$_2$CO$_3$.

The electron injection layer may be formed using, for example, LiF, NaCl, CsF, Li$_2$O, BaO, Liq, or Rb$_2$CO$_3$.

The second electrode 19 may be on the organic layer 15. The second electrode 19 may include an alkaline metal such as lithium, sodium, potassium, rubidium, or cesium; an alkaline earth metal such as beryllium, magnesium, calcium, strontium, or barium; a metal such as aluminum, scandium, vanadium, zinc, yttrium, indium, cerium, samarium, europium, terbium, or ytterbium; an alloy of at least two of the listed single metals; an alloy of at least one of the listed single metals and at least one of gold, silver, platinum, copper, manganese, titanium, cobalt, nickel, tungsten, and tin; or a composite including at least two selected from the listed single metals. If needed, a UV-ozone treated indium tin oxide (ITO) may also be used in the second electrode 19. The second electrode 19 may be formed using for example, indium tinoxide (ITO), indium zinc oxide (IZO), zinc oxide (ZnO), or graphene. For a top-emission type, the second electrode 19 may be formed of a transparent oxide, for example, ITO, IZO, ZnO, or graphene.

Although the organic light-emitting device 10 and various embodiments thereof have been described above with reference to FIG. 1, embodiments are not limited thereto.

One or more embodiments of organic light-emitting devices according to the present disclosure will now be described in detail with reference to the following examples, including reference examples. However, these examples are only for illustrative purposes and are not intended to limit the scope of the one or more embodiments of the present disclosure.

EXAMPLES

Evaluation Example 1: Lowest Excited Triplet Energy Level Measurement

Lowest excited triplet energy levels of the compounds mCP, PO15, DTPPDDA, BDAPM, TBPe, and mCP:B3PYMPM (1:1 by weight ratio) were measured based on density functional theory (DFT) calculation and photoluminescence (PL) spectra of delayed fluorescence of each compound at an extremely low temperature (18K), excluding initial PL spectra. The results are shown in Table 1.

TABLE 1

| Compound | Lowest excited triplet energy level (eV) |
|---|---|
| mCP | 2.94 |
| PO15 | 3.07 |
| DTPPDDA | 2.79 |
| BDAPM | 2.73 |
| TBPe | 2.75 |
| mCP:B3PYMPM | 2.9 |

Referring to Table 1, all the compounds were found to have a lowest excited triplet energy level satisfying Inequation 1.

Evaluation Example 2: Measurement of Characteristics of Organic Light-Emitting Device 1) Example 1

As an anode, a glass substrate, having patterned thereon ITO of a thickness of about 100 nm, was prepared by cleaning with isopropyl alcohol and acetone and then exposure to UV-ozone for about 10 minutes. mCP (96 wt %) and ReO$_3$ (4 wt %) were co-deposited on the glass substrate to form a first hole transport layer having a thickness of about 45 nm. mCP was then deposited on the first hole injection layer to form a second hole transport layer having a thickness of about 15 nm. Next, mCP (as a first compound, 85.5 wt %), Ir(HFP)$_2$(pic) (as a second compound, 8 wt %), DTPPDDA (as a third compound, 6 wt %), and TBPe (as a fourth compound, 0.5 wt %) were co-deposited on the second hole transport layer to form an emission layer having a thickness of about 15 nm. TSPO1 was deposited on the emission layer to form a first electron transport layer having a thickness of about 15 nm. After Rb$_2$CO$_3$ (4 wt %) and TSPO1 (96 wt %) were co-deposited on the first electron transport layer to form a second electron transport layer having a thickness of about 50 nm, Al was deposited thereon to form a cathode having a thickness of about 100 nm, thereby completing manufacture of an organic light-emitting device. The formed layers described above were obtained through thermal deposition under a constant vacuum of about 5×10$^{-7}$ Torr.

2) Example 2

An organic light-emitting device was manufactured in the same manner as in Example 1, except that mCP (as a first compound, 39.75 wt %), Ir(ppz)$_3$ (as a second compound, 10 wt %), DTPPDDA (as a third compound, 10 wt %), TBPe (as a fourth compound, 0.5 wt %), and B3PYMPM (as a fifth compound, 39.75 wt %) were used to form the emission layer.

2) Example 3

An organic light-emitting device was manufactured in the same manner as in Example 1, except that mCP (as a first compound, 36.75 wt %), Ir(HFP)$_2$(pic) (as a second compound, 10 wt %), BDAPM (as a third compound, 16 wt %), TBPe (as a fourth compound, 0.5 wt %), and PO15 (as a fifth compound, 36.75 wt %) were used to form the emission layer.

3) Comparative Example 1

An organic light-emitting device was manufactured in the same manner as in Example 1, except that mCP (as a first compound, 93.5 wt %), DTPPDDA (as a third compound, 6 wt %), and TBPe (as a fourth compound, 0.5 wt %) were used to form the emission layer.

4) Comparative Example 2

An organic light-emitting device was manufactured in the same manner as in Example 1, except that mCP (as a first compound, 44.75 wt %), DTPPDDA (as a third compound, 10 wt %), TBPe (as a fourth compound, 0.5 wt %), and B3PYMPM (as a fifth compound, 44.75 wt %) were used to form the emission layer.

5) Comparative Example 3

An organic light-emitting device was manufactured in the same manner as in Example 1, except that mCP (as a first compound, 41.75 wt %), BDAPM (as a third compound, 16 wt %), TBPe (as a fourth compound, 0.5 wt %), and PO15 (as a fifth compound, 41.75 wt %) were used to form the emission layer.

External quantum efficiencies of the organic light-emitting devices of Examples 1 to 3 and Comparative Examples 1 to 3 were measured. The results are shown in Table 2 and FIGS. 2 to 4.

TABLE 2

| Example | External quantum efficiency (%) |
| --- | --- |
| Example 1 | 12.3 |
| Example 2 | 7.0 |
| Example 3 | 9.1 |
| Comparative Example 1 | 5.6 |
| Comparative Example 2 | 3.0 |
| Comparative Example 3 | 7.5 |

Figure 2:
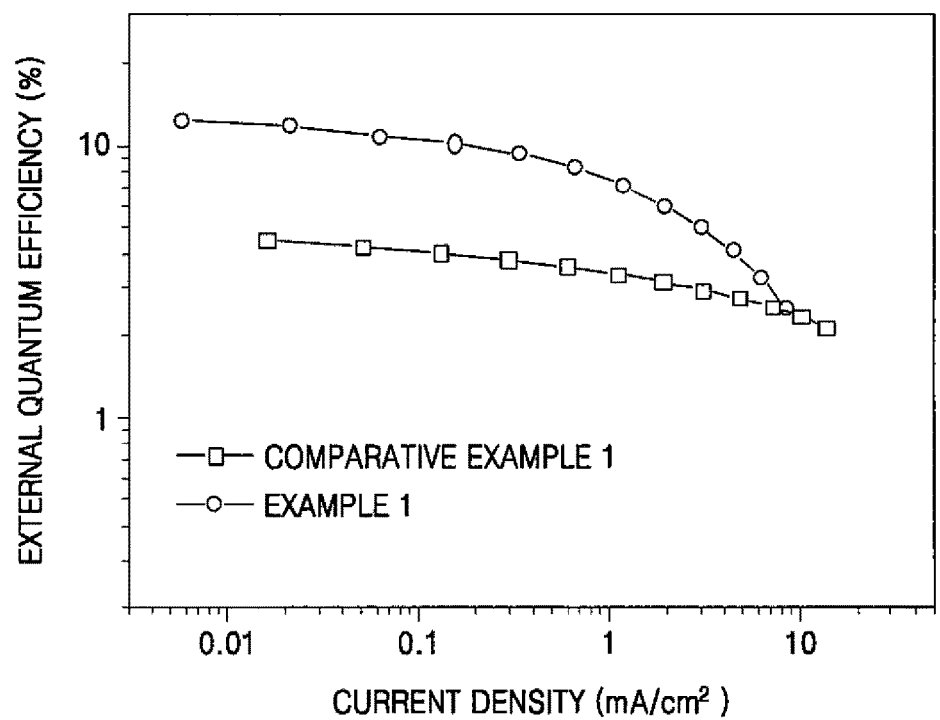
FIG. 2 is a graph of external quantum efficiency (%) with respect to current density (mA/cm$^2$) of organic light-emitting devices of Example 1 and Comparative Example 1.
Figure 3:
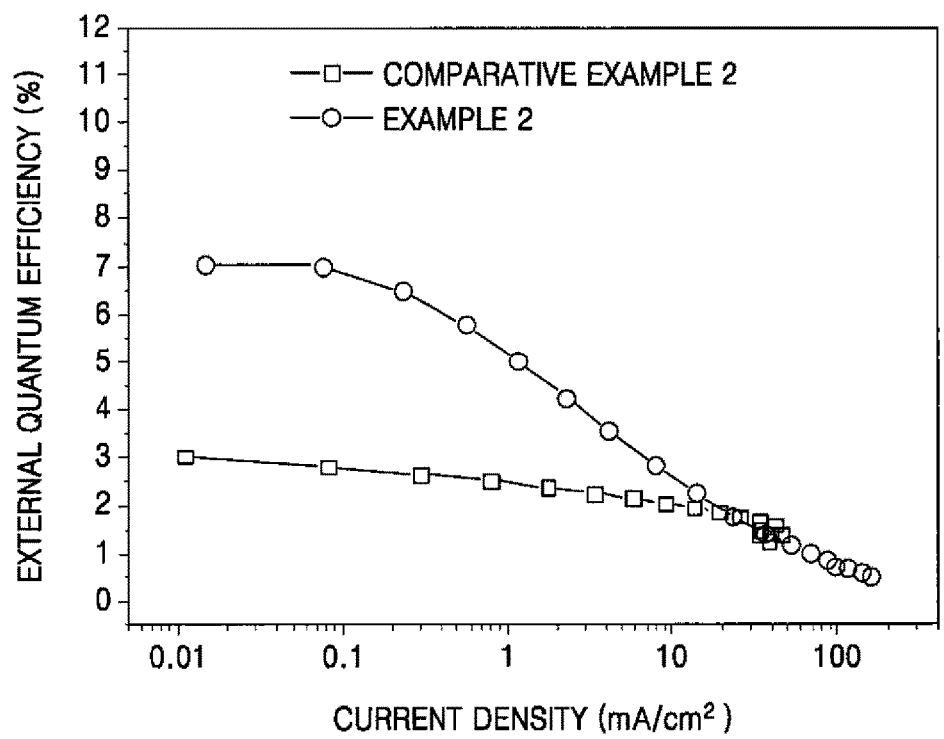
FIG. 3 is a graph of external quantum efficiency (%) with respect to current density (mA/cm$^2$) of organic light-emitting devices of Example 2 and Comparative Example 2.
Figure 4:
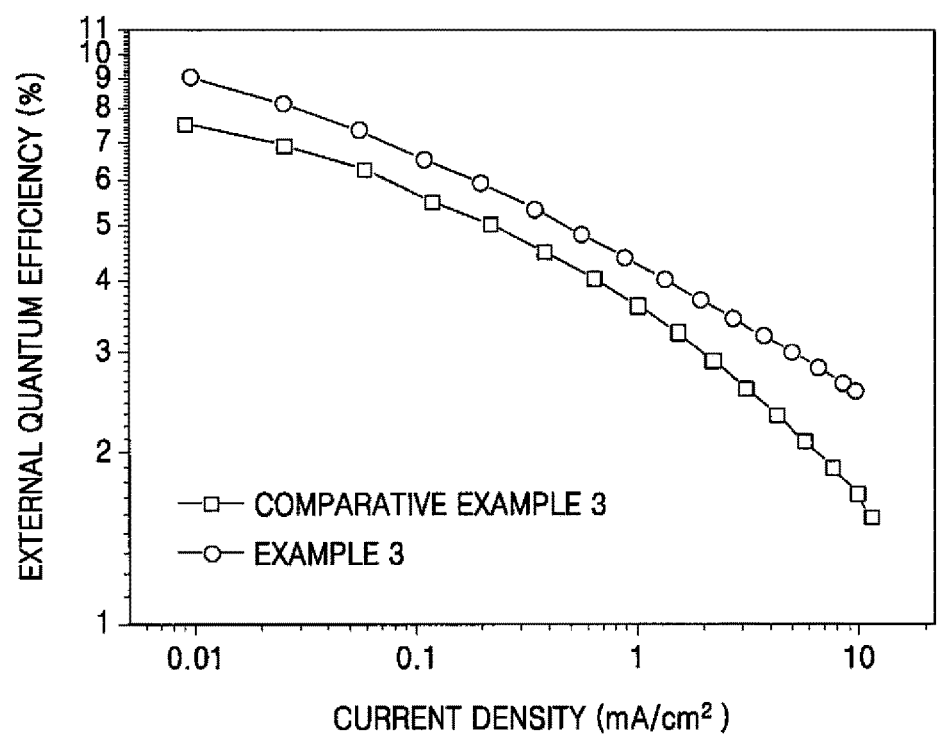
FIG. 4 is a graph of external quantum efficiency (%) with respect to current density (mA/cm$^2$) of organic light-emitting devices of Example 3 and Comparative Example 3.

Referring to FIGS. 2 to 4 and Table 1, the organic light-emitting devices of Examples 1 to 3 were each found to have an improved external quantum efficiency, when compared respectively to the organic light-emitting devices of Comparative Examples 1 to 3.

As described above, according to the one or more embodiments, an organic light-emitting device including different compounds satisfying Inequation 1 in an emission layer may have improved efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. An organic light-emitting device comprising:
a first electrode;
a second electrode; and
an organic layer between the first electrode and the second electrode,
wherein the organic layer comprises an emission layer;
the emission layer comprises a first compound, a second compound, a third compound, and a fourth compound, and
a lowest excited triplet energy level ($H_{T1}$) of the first compound, a lowest excited triplet energy level ($DFD_{T1}$) of the third compound, and a lowest excited triplet energy level ($FD_{T1}$) of the fourth compound satisfy Inequation 1:

$$H_{T1} > DFD_{T1} > FD_{T1} \qquad \text{<Inequation 1>}$$

2. The organic light-emitting device of claim 1, wherein, based on a total weight of the first, second, third and fourth compounds in the emission layer, an amount of the first compound is greater than or equal to an amount of each of the second, third, and fourth compounds in the emission layer.

3. The organic light-emitting device of claim 1, wherein the second compound comprises a metal atom having an atomic weight of about 40 or greater.

4. The organic light-emitting device of claim 1, wherein a difference between a lowest excited singlet energy level ($DFD_{S1}$) and the lowest excited triplet energy level ($DFD_{T1}$) of the third compound at about 77K is in a range of greater than about 0 eV to about 0.3 eV or less.

5. The organic light-emitting device of claim 1, wherein the third compound is represented by one of Formulae 1 to 3:

D-C-A     <Formula 1>

D-C-A-C-D     <Formula 2>

A-C-D-C-A     <Formula 3> wherein, in Formulae 1 to 3,
D is an electron donating group;
C is a linking group; and
A is an electron accepting group.

6. The organic light-emitting device of claim 1, wherein the fourth compound emits light.

7. The organic light-emitting device of claim 1, wherein a maximum light emission wavelength of the fourth compound is about 350 nm to about 550 nm.

8. The organic light-emitting device of claim 1, wherein, based on a total weight of the first, second, third and fourth compounds in the emission layer, an amount of the fourth compound is smaller than an amount of each of the first, second, and third compounds in the emission layer.

9. The organic light-emitting device of claim 1, wherein the emission layer further comprises a fifth compound.

10. The organic light-emitting device of claim 9, wherein the first compound and the fifth compound are each independently selected from a carbazole-containing compound, and aromatic amine compound, a π-electron-deficient heteroaromatic compound, a phosphine oxide-containing compound, and a sulphur oxide-containing compound, and
the first compound and the fifth compound are different from one another.

* * * * *